US007253616B2

(12) United States Patent
Bolle et al.

(10) Patent No.: US 7,253,616 B2
(45) Date of Patent: Aug. 7, 2007

(54) MICROELECTROMECHANICAL MAGNETOMETER

(75) Inventors: Christian A. Bolle, Bridgewater, NJ (US); Maria E. Simon, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 6 days.

(21) Appl. No.: 11/250,123

(22) Filed: Oct. 13, 2005

(65) Prior Publication Data

US 2007/0085533 A1    Apr. 19, 2007

(51) Int. Cl.
  *G01R 33/02* (2006.01)
  *G01R 27/26* (2006.01)
(52) U.S. Cl. ...................... 324/244; 324/662
(58) Field of Classification Search ................ 324/662, 324/259, 260, 261, 257, 258, 658, 244
See application file for complete search history.

(56) References Cited

U.S. PATENT DOCUMENTS

| | | | | |
|---|---|---|---|---|
| 4,916,393 A | * | 4/1990 | Crescini et al. | 324/244 |
| 5,341,117 A | * | 8/1994 | Singbartl | 336/92 |
| 5,392,658 A | * | 2/1995 | Okada | 73/862.043 |
| 5,501,893 A | | 3/1996 | Laermer et al. | |
| 5,818,227 A | * | 10/1998 | Payne et al. | 324/259 |
| 5,963,367 A | | 10/1999 | Aksyuk et al. | |
| 6,122,961 A | | 9/2000 | Geen et al. | |
| 6,304,083 B1 | * | 10/2001 | Owens | 324/258 |
| 6,664,786 B2 | * | 12/2003 | Kretschmann et al. | 324/259 |
| 6,667,823 B2 | | 12/2003 | Greywall | |
| 6,713,367 B2 | | 3/2004 | Solgaard et al. | |
| 6,925,710 B1 | | 8/2005 | Scalf et al. | |
| 7,085,122 B2 | * | 8/2006 | Wu et al. | 361/277 |
| 2004/0036483 A1 | * | 2/2004 | Borwick et al. | 324/663 |
| 2005/0241394 A1 | * | 11/2005 | Clark | 73/504.12 |
| 2006/0105467 A1 | * | 5/2006 | Niksa et al. | 436/150 |
| 2007/0030001 A1 | * | 2/2007 | Brunson et al. | 324/253 |

OTHER PUBLICATIONS

Judy, "Shock-Resistant Low-Power MEMS Magnetometer", pp. 1-3.
Yee, "Shock-Resistant Low-Power Ferromagnetic MEMS Magnetometer", pp. 1-2.
Bolle, "Observation of Mesoscopic Vortex Physics Using Micromechanical Oscillators", May 6, 1999, NATURE, vol. 399, pp. 43-46.
Moreland, "Micromechanical Instruments for Ferromagnetic Measaurements", 2003, J. Phys. D., Appl. Phys. vol. 36, pp. R39-R51.
Yee, "Dynamic Response and Shock Resistance of Ferromagnetic Micromechanical Magnetometers," pp. 1-4.
Yang, "Ferromagnetic Micromechanical Magnetometer", 2002, Sensors and Actuators, vol. A97-98, pp. 88-97.
Leïchlé, "A low-power resonant micromachined compass", Journal of Micromechanics and Microengineering, vol. 14, 2004, pp. 462-470.

* cited by examiner

*Primary Examiner*—Anjan Deb

(57) ABSTRACT

An apparatus comprising a substrate and a MEM device. The MEM includes a comb capacitor and a magnetic element physically connected to one electrode of the comb capacitor. The magnetic element is capable of moving the one electrode in a manner that alters a capacitance of the comb capacitor. The apparatus also includes at least one spring physically connecting the magnetic element to the substrate.

19 Claims, 14 Drawing Sheets

MICROELECTROMECHANICAL MAGNETOMETER

TECHNICAL FIELD OF THE INVENTION

The present invention relates, in general, to devices for measuring magnetic fields, as well as methods of using and manufacturing such devices.

BACKGROUND OF THE INVENTION

The measurement of magnetic fields has many applications, such as navigation, metal detection in security settings, and oil and mineral prospecting. There is a longstanding need for inexpensive low-power apparatus to detect small changes in magnetic fields over large ranges. Existing apparatus are deficient in one or more of these desirable features.

For example, certain microelectromechanical (MEM) magnetometers only measure changes in magnetic fields over a small range of intensity. Thus, multiple magnetometers, each adjusted to a different range of magnetic field, may be needed to cover a desired range. Also, some magnetometers respond nonlinearly to changes in the magnetic field intensity. Consequently, extensive and complex calibrations are needed to use these magnetometers. In other instances, components of magnetometers can become distorted when moving in response to a change in the magnetic field, thereby altering the physical or electrical response of the magnetometer itself. In still other cases, the fabrication of magnetometers is complex and expensive.

Similarly, other magnetometers like the flux gate magnetometers or the search coils require large size electrical coils to attain high sensitivities. They also require passing large currents through the coils during measurements thereby causing large power consumption.

Other magnetometers like the superconducting quantum interference devices are very sensitive magnetometers, but require cryogenic temperatures to operate.

SUMMARY OF THE INVENTION

To address one or more of the above-discussed deficiencies, one embodiment of the present invention is an apparatus. The apparatus comprises a substrate and a MEM device. The MEM device includes a comb capacitor and a magnetic element physically connected to one electrode of the comb capacitor. The magnetic element is capable of moving the one electrode in a manner that alters a capacitance of the comb capacitor. The apparatus further comprises at least one spring physically connecting the magnetic element to the substrate.

Another embodiment is a method of use. The method comprises placing the aforementioned apparatus in a magnetic field and changing the magnetic field to cause the magnetic element to move the one electrode in a manner that alters a capacitance of the comb capacitor.

Yet another embodiment comprises a method of manufacture. The method comprises etching substrate to simultaneously form the aforementioned MEM device and spring. The method further comprises physically connecting a magnetic element to one electrode of the comb capacitor, the magnetic element configured to move the one electrode to alter a capacitance of the comb capacitor.

BRIEF DESCRIPTION OF THE DRAWINGS

Various embodiments are understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which.

DETAILED DESCRIPTION

The various embodiments use MEM devices having comb capacitors to facilitate the measurement of magnetic field intensity and direction. The term comb capacitor as used herein is defined as a structure having at least two electrodes, wherein each electrode has a plurality of substantially parallel fingers projecting from opposing surfaces of the electrodes. The two electrodes are configured so that the fingers of one interdigitate with the fingers of the other electrode. Exemplary comb capacitor designs are presented in U.S. Pat. Nos. 6,667,823; 5,963,367; 6,122,961, 6,713,367; and 6,925,710, which are incorporated by reference herein in their entirety.

Figure 1A:
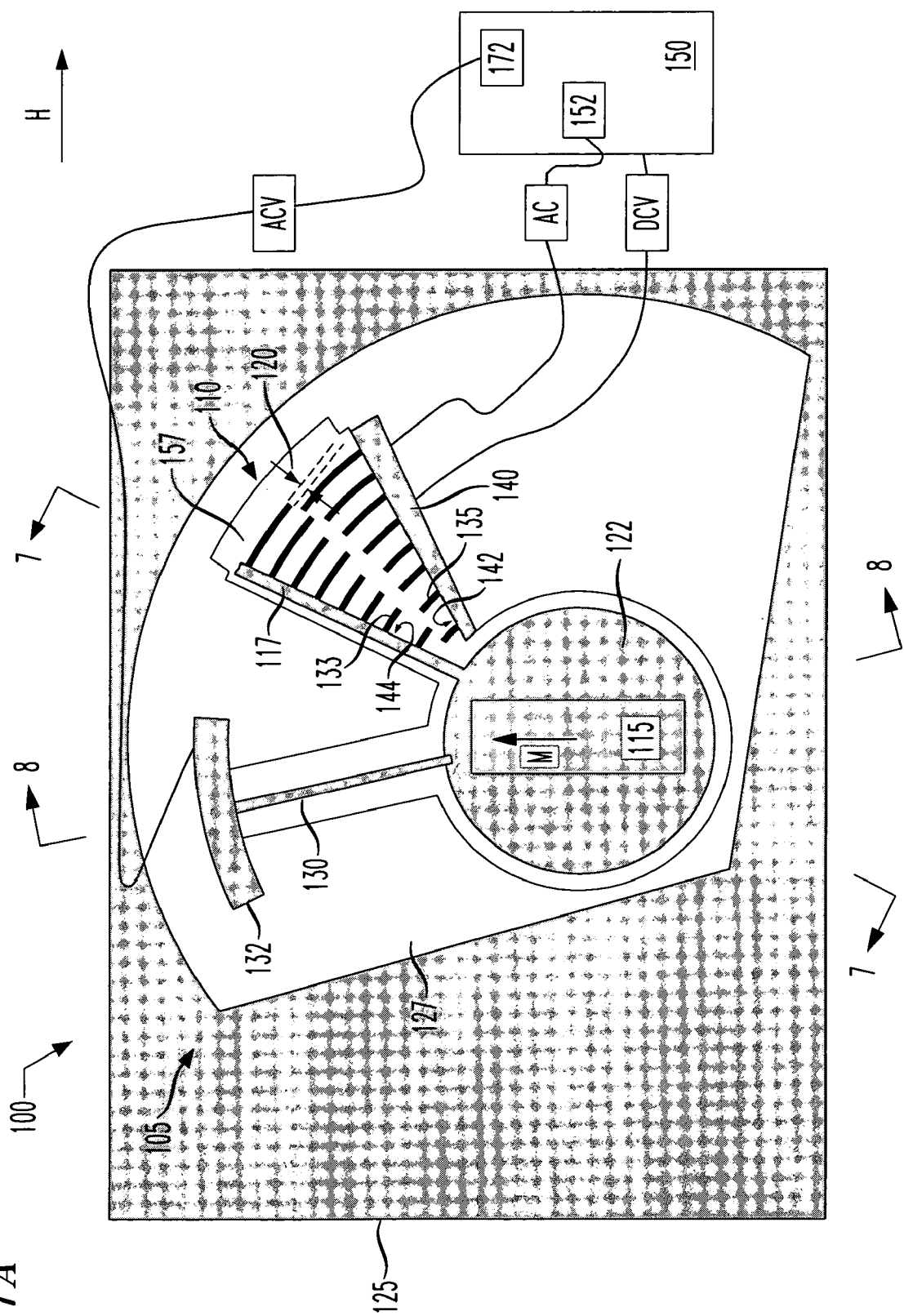
FIGS. 1A, 1B and 1C present a plan views of an exemplary embodiments of an apparatus having different MEM devices.
Figure 1B:
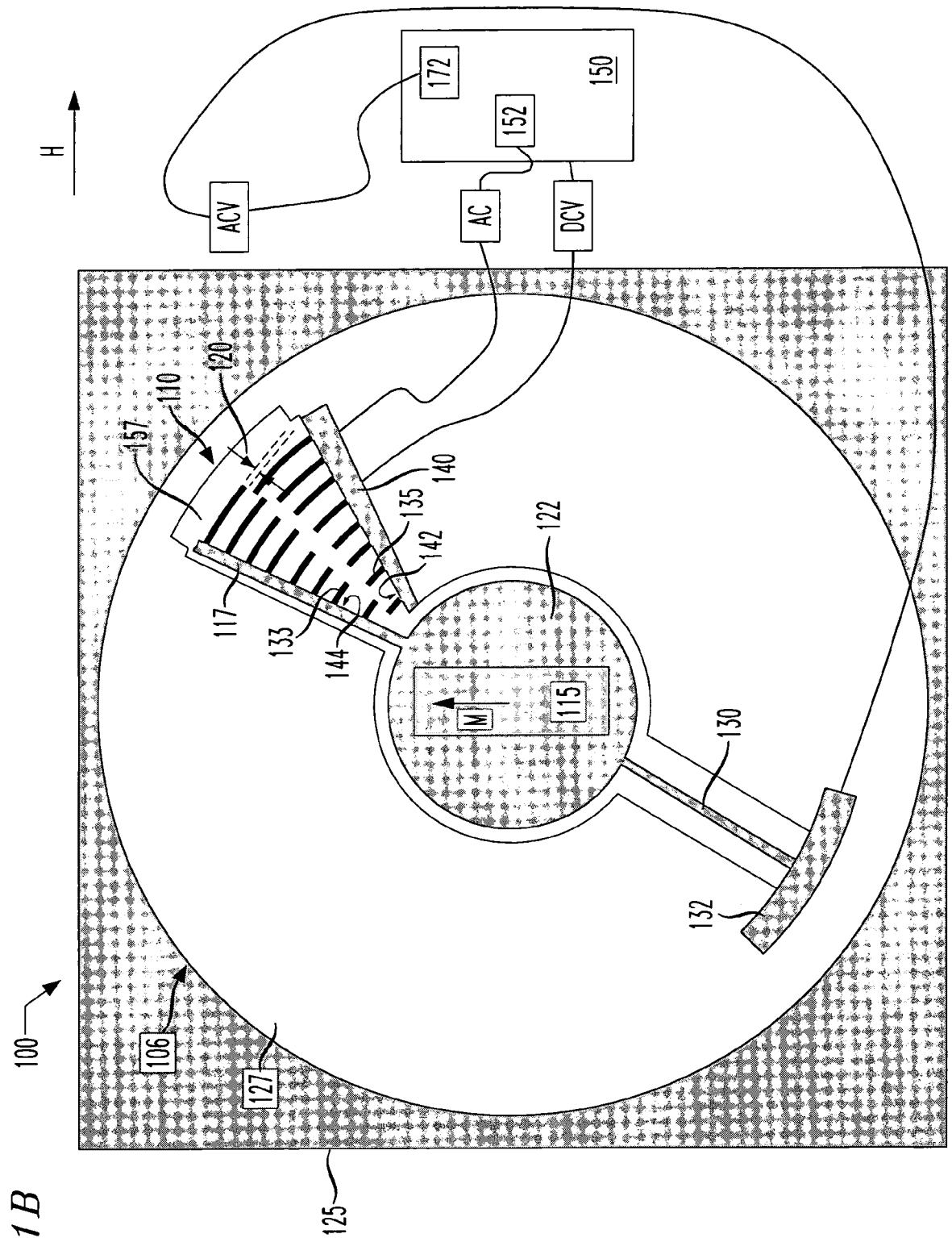
Figure 1C:
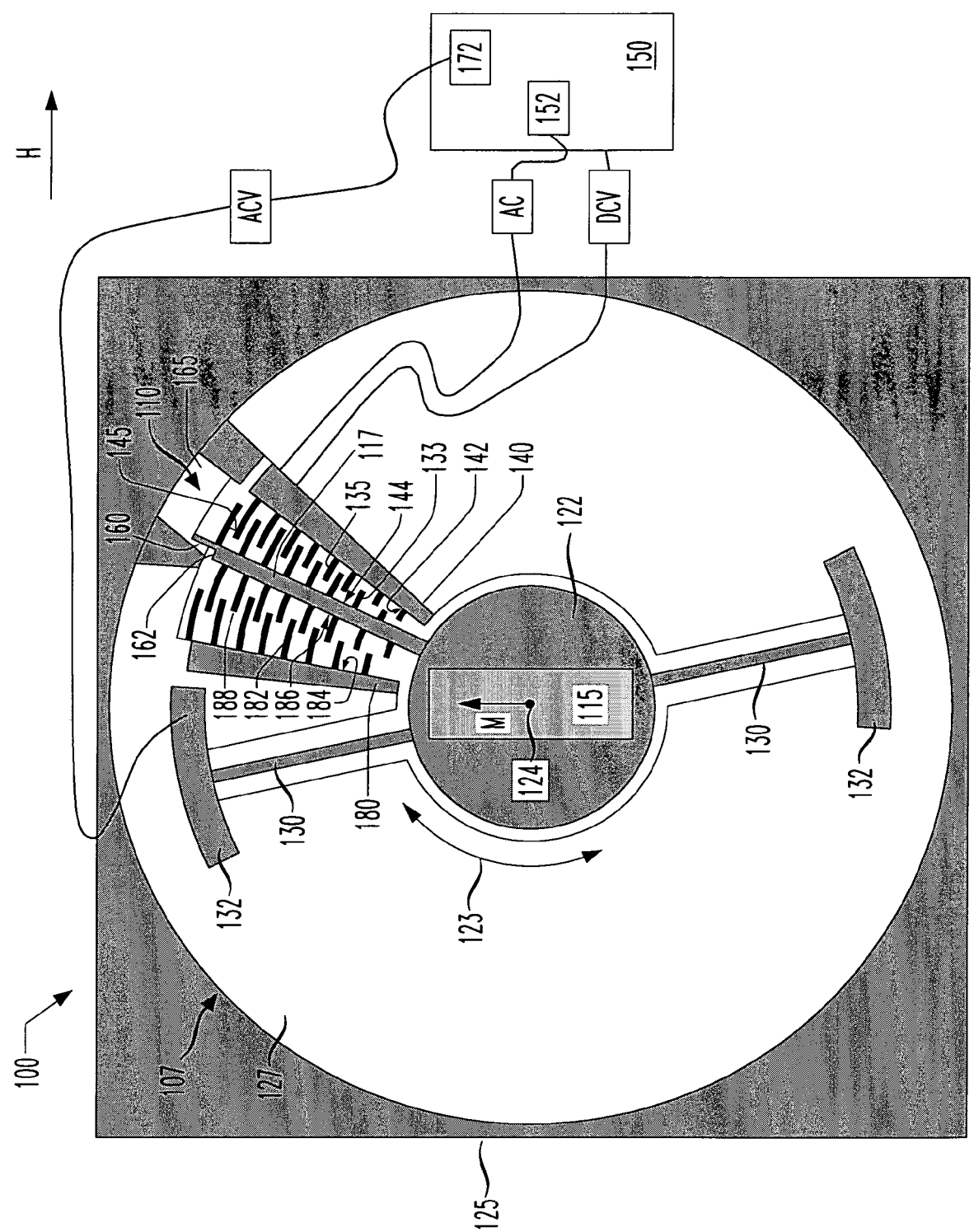

FIGS. 1A, 1B and 1C present a plan views of an exemplary embodiments of an apparatus 100 having different MEM devices 105, 106, 107. Turning to FIG. 1A, the apparatus 100 comprises a MEM device 105. The MEM device 105 includes a comb capacitor 110, one or more spring elements 130, hub 122, and magnetic element 115. The magnetic element 115 is capable of moving one electrode 117 of the comb capacitor 110 in a manner that alters the capacitance of the comb capacitor 110. The term MEM device as used herein refers to a structure having at least one component with a dimension that is about a few micrometers (e.g., at least about 1 to 2 micrometers) in size. For example, in some preferred embodiments, the one electrode 117 has fingers of three to six microns in width 120.

The comb capacitor 110 includes first and second electrodes 117, 140. The moveable electrode 117 has fingers 133 that interdigitate with the fixed fingers 135 of a fixed electrode 140 of the comb capacitor 110. The electrode 117 can move in opening 157. The fixed fingers 133 project from a fixed surface 142 of the fixed electrode 140 that opposes a surface 144 of the moveable electrode 117. Thus, each electrode 117, 140 has an array of conducting fingers 133, 135, that physically interdigitate with the fingers 133, 135 of the other electrode 117, 140. The one or more spring elements 130 flexibly attach the hub 122 to a substrate 125. The one or more springs 130 may, e.g., connect to an anchor 132 of the substrate 125. Examples of the one or more springs 130 include bars, one or more serpentine springs and another combination of spring elements. The magnetic element 115 is fixed to the hub 122, which is in turn rigidly connected to one electrode 117 of the comb capacitor 110.

The MEM device 105 may be located near one surface of the substrate 125, e.g., in an opening 127 of the substrate 125.

The movement of the magnetic element 115 can cause the hub 122 to be moved by e.g., being displaced in the plane of the view shown in FIG. 1A due to the flexible connection that the one or more spring elements 130 provide to the substrate 125. This movement can be measured by measuring the change in capacitance of the comb capacitor 110 due to the movement of the electrode 117.

The apparatus 100 can incorporate additional features to improve the apparatus's stability, sensitivity and accuracy. For instance, the apparatus 100 can incorporate a plurality of the above-described components into the MEM device and, in some cases, these components are arranged in a symmetrical fashion. Examples are illustrated in FIGS. 1B and 1C, which present plan views of the apparatus 100 showing alternative MEM devices 106, 107. Similar reference numbers are used to depict similar elements to that presented in FIG. 1A. As shown in FIG. 1B, for some preferred embodiments of the MEM device 106, the spring 130 and comb capacitor 110 are symmetrically located on opposing sides of the magnetic element 115.

For the apparatus 100 depicted in FIG. 1C, the spring elements 130 are configured to facilitate the rotational movement of the moveable elements 117. For example, two spring elements 130 are symmetrically arranged about the hub 122. In such embodiments, the hub 122 can rotate 123 about an axis 124 due to the flexible connection that the one or more spring elements 130 provide to the substrate 125.

One skilled in the art would understand how to make one or more spring elements 130 having the desired stiffness to enable the above-described displacement and rotation. The axis 124 of rotation can, e.g., be approximately perpendicular to a surface of the substrate 125. Since the magnetic element 115 is substantially rigidly fixed to the hub 122, rotation 123 of the hub 122 is associated with a corresponding rotation 123 of the magnetic element 115. The rotation 123 of the magnetic element 115 and hub 122 move electrode 117 in a manner that increase or decreases the amount of interdigitation by the fingers 135, 133 thereby changing the capacitance of comb capacitor 110.

With continuing reference to FIGS. 1A-1C, in the MEM devices 105, 106, 107, the magnetic element 115 is subjected to forces due to the local applied magnetic field H and the one or more spring elements 130. The magnetic element 115 has a magnetic moment M so that an applied magnetic field H exerts a torque, T, where $T_M = M \times H$ on the magnetic element 115. In response to the field H, the magnetic element 115 will move in an attempt to align its magnetic moment M with the direction of the magnetic field H. The one or more spring elements 130 apply a torque $T_S$ that tends to cause the magnetic element 115 to e.g., rotate in MEM device 107. In embodiments where the one or more spring elements 130 are Hookian, the torque $T_S$ may be approximately expressed by $-K\Theta$ for small values of the rotation angle $\Theta$. Here, K is the elastic stiffness matrix for the one or more spring elements 130. In equilibrium, the magnetic torque and the elastic torque cancel each other so that M×H is approximately equal to +K$\Theta$. Thus, a change in the value of the applied field H causes a change in the value of the rotation angle $\Theta$ of the magnetic element 115. The change in the value of the rotation angle $\Theta$ causes a change in the amount of interdigitation of the fingers 133, 135 and thus, changes the capacitance of the comb capacitor 110. A rotation that causes the area of overlap between the interdigitated fingers to increase will also increase the capacitance of the comb capacitor 110. A rotation that causes the area of overlap between the interdigitated fingers to decrease will also decrease the capacitance of the comb capacitor 110.

Often, the capacitance of the comb capacitor 110 is approximately linearly dependent on the amount of overlap between the interdigitated fingers 133, 135. Thus, the change in the rotation angle $\Theta$ of the magnetic element 115 can be approximately linearly related to the change in the capacitance of the capacitor 110.

In some preferred embodiments the MEM device 105, 106, 107 is configured to detect changes in a magnetic field H. By sensing the change in magnetic field H the apparatus 100 can function as a metal detector or magnetometer.

As discussed above, the comb capacitor's 110 capacitance can be linearly dependent on the amount of interdigitation, and more specifically, linearly dependent on the area of overlap between adjacent fingers 133, 135 of the electrodes 117, 140. The linear dependence facilitates the determination of the relationship between the movement of the electrode 117 caused by the magnetic element 115 and the change in capacitance.

Preferably, a gap 145 between the adjacent interdigitated fingers 133, 135 remains constant throughout the movement of the electrode 117. As illustrated in FIG. 1C, the fingers 133, 135 can be arc-shaped to help maintain a constant gap 145 as the one electrode 117 rotates. The use of a comb capacitor 110 configured to maintain a constant gap 145 is in contrast to some capacitors used in conventional MEM magnetometers, where the capacitance is changed by adjusting the size of the gap between the electrodes of the capacitor. This is not favored because the change in capacitance is non-linearly dependent on the change in the gap between electrodes. Non-linearly is undesirable because complex calibrations are required to determine the relation between the movement of the magnetic element and the change in capacitance.

As shown in FIGS. 1A-1C, to measure capacitance an AC voltage (ACV) is applied via an electrical source 150 to one electrode, e.g., the moveable electrode 117. For example, the ACV can be applied to anchor 132, which in turn is coupled to the electrode 117 via the spring 130 and hub 122. When the ACV is applied to one electrode, the charge on the capacitor 110 changes in proportion to the applied voltage. This causes an alternating current (AC) to flow in or out of the capacitor 110. The AC is proportional to the capacity of the capacitor 110. AC can be measured using an operational amplifier 152 coupled to the other electrode, e.g., the fixed electrode 140. In some embodiments, AC ranges from about 0 to about 2 nanoamperes.

In embodiments of the MEM device 107 such as shown in FIG. 1C, the electrode 117 moved by the magnetic element 115 can rotate through an angle of rotation $\Theta$ of at least about 1 degree. In other embodiments the angle of rotation $\Theta$ can be at least about 10 degrees. In still other embodiments the angle of rotation $\Theta$ can be at least about 90 degrees. This is in contrast to certain conventional MEM magnetometers whose capacitor components are configured to rotate over a much narrower range (e.g., less than 1 degree and sometimes less than 0.1 degree). The comparatively larger range of rotation of embodiments of the capacitor 110 of provides a larger range of capacitance. This can be used to increase the dynamic range or sensitivity of magnetic field H measured by the apparatus 100.

In some preferred embodiments, the angle of rotation $\Theta$ in response to a movement of the magnetic element 115 ranges from about 0 to about 180 degrees. In other embodiments, the angle of rotation $\Theta$ ranges from about 0 to about 5 degrees, and in other cases from about 1 to about 5 degrees.

The angle of rotation Θ traversed by the moveable electrode 117 can be limited by providing a mechanical stopper 160. For example, as illustrated in FIG. 1C, the stopper 160 can be located on an end 162 of the electrode 117. The substrate 125 can be configured to provide an opening 165 to contain the stopper 160 therein, thereby limiting the angle of rotation Θ of the electrode 117. The stopper 160 can prevent the fingers 133 of the electrode 117 from contacting the fixed surface 142. This is desirable in instances where contact could cause an electrical short circuit that renders the apparatus 100 inoperable. It is possible to add more stoppers to limit the movement on other directions, e.g., lateral displacements.

As also illustrated in FIGS. 1A-1C, the electrical source 150 can be configured to apply a DC voltage (DVC) to one of the electrodes 117, 140 of the comb capacitor 110. For instance, the electrical source 150 can comprises a drive circuit 172 configured to apply the DCV to the fixed electrode 140. In some embodiments of the apparatus 100, the DCV ranges from about 0 to about 20 volts, and in other cases, from about 0 to about 5 volts. The DCV can be configured to attract the moving electrode 117 to the fixed electrode 140.

As illustrated in FIG. 1C, the comb capacitor 110 can further include a second fixed electrode 180 having second fixed fingers 182 that project from a second fixed surface 184. The DCV can be configured to attract the moveable electrode 117 to one or the other of the fixed electrodes 140, 180. For instance, the DCV can rotate the moveable electrode 117 towards the fixed electrode 140 and away from the second fixed electrode 180.

As also illustrated in FIG. 1C, the second fixed surface 184 opposes a second surface 186 of the one electrode 117 that moves and fingers 188 can project from the second surface 186. The fingers 188 interdigitate with the second fixed fingers 182. It is advantageous for the fingers 133, 188 to be equal in number and to be symmetrically arranged about the movable electrode 117. In such instances, the amount of overlap between the first 133, 135 and second 182, 188 pairs of interdigitated fingers will be equal and opposite as the electrode 117 moves towards one of the fixed electrodes 140, 180. The comb capacitors 110 can have an initial overlap so opposite combs will produce equal and oppose change in overlap. In such instances, the change in the amount of overlap between the first 133,135 and second 182, 188 pairs of interdigitated fingers will be equal and opposite as the electrode 117 moves towards one of the fixed electrodes 140, 180.

If the electrode 117 moves towards the first fixed electrode 140, then the amount of overlap between the first pair of interdigitated fingers 133, 135 increases. Consequently the capacitance between the first pair of interdigitated fingers 133, 135 increases. Concurrently, the electrode 117 will move away from the second fixed electrode 180. Consequently, the amount of overlap between the second pair of interdigitated fingers 182, 188 decreases, causing a decrease in the capacitance between these two fingers. The difference in capacitance between the first pairs of interdigitated fingers 133, 135 and the second pair of interdigitated fingers 182, 188 can be compared to determine the movement of the magnetic element 115. This can obviate the need to perform reference calibrations of the comb capacitor 110.

The applied DCV can be used to measure the amount of movement of the magnetic element 115 caused by the magnetic field H. To facilitate this measurement, the electrical source 150 can be configured to apply a DCV to produce a torque on the magnetic element 115 that is in the opposite direction to the torque on the magnetic element 115 caused by the magnetic field H. The DCV can be adjusted so that the moveable electrode 117 is returned to its original position, that is, its position before being moved by the magnetic element 115. Under such conditions, the comb capacitor's capacitance is also returned to its original value because the movement of the electrode 117 restores the original amount of overlap between the interdigitated fingers 133, 135. One way to determine the appropriate DCV for this purpose is to adjust the DCV until AC is returned to its original value.

The capacitance changes resulting from the change in overlap between the first 133, 135 and second 182, 188 pairs of interdigitated fingers can be manipulated, by adding or averaging them to thereby improve the accuracy of the measurement of the angle of rotation Θ. Furthermore, the adding or averaging of capacitances from symmetrically arranged capacitors 110 can compensate for undesired changes in capacitance due to movements of the capacitor, such as lateral displacements. Consequently, the intensity and direction of the magnetic field H can be determined more accurately than using a comb capacitor having a single pair of interdigitated fingers.

In embodiments where an electrical source 150 is used to apply a DVC, the change in capacitances between the first 133, 135 and second 182, 188 pairs of interdigitated fingers can be added together. In some cases, for instance, the applied DCV is adjusted until the sum of changed capacitances equals zero.

Figure 2:
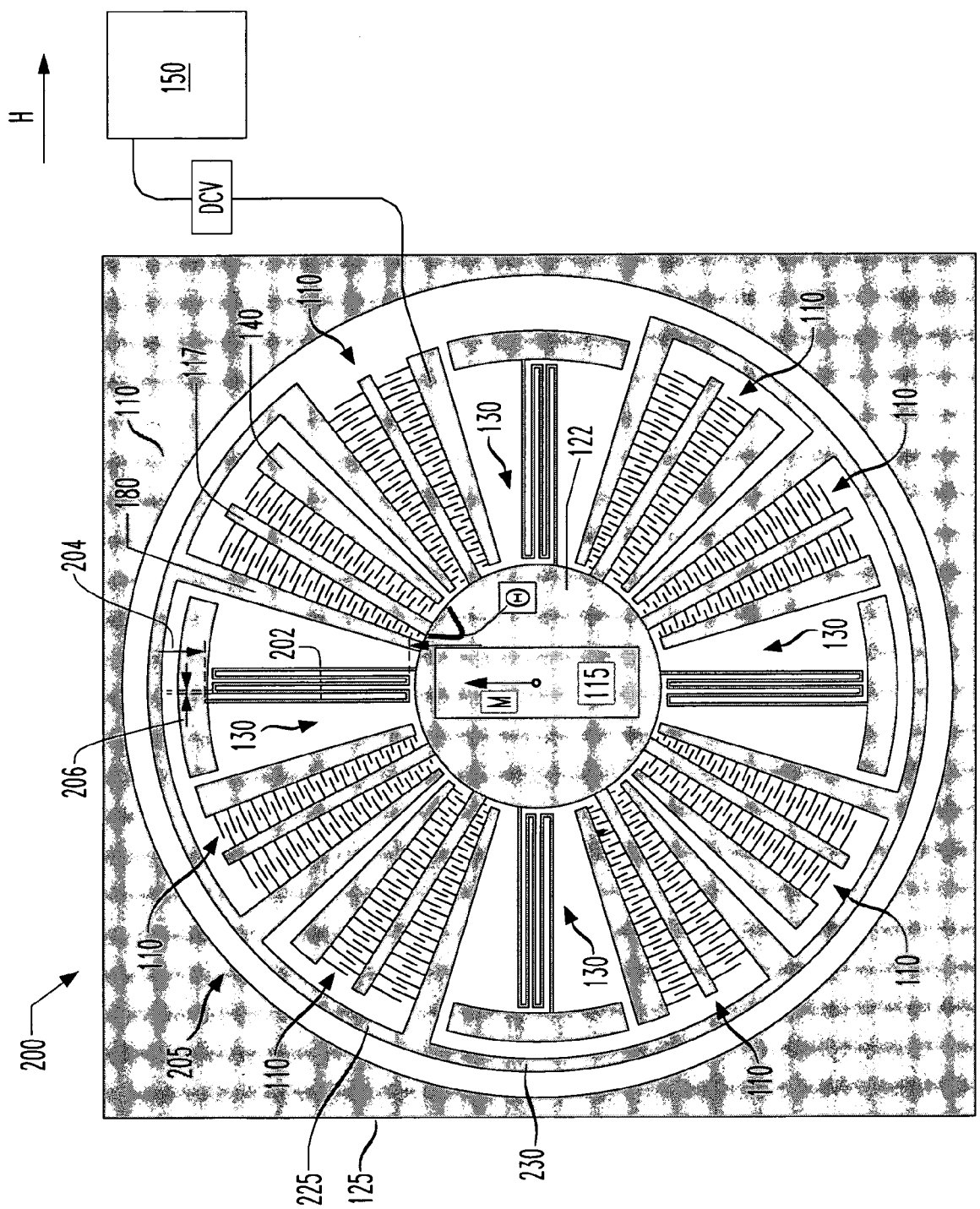
FIG. 2 presents a plan view of another exemplary embodiment of an apparatus.

Still another embodiment of the apparatus is depicted in FIG. 2. FIG. 2 uses the same reference numbers to depict analogous structures shown in FIGS. 1A-1C. For clarity, only selected electrical connections between the MEM device 105 and other components of the apparatus 200 are shown. Any of the various embodiments of the apparatus discussed above and illustrated in FIGS. 1A-1C could be incorporated into the apparatus 200 shown in FIG. 2.

As illustrated in FIG. 2, the MEM device 105 comprises a plurality of springs 130 that physically connect the magnetic element 115 to the substrate 125. Using a plurality of springs 130 advantageously stabilizes the MEM device 105 thereby making it more shock resistant. In addition, using a plurality of springs 130 better deters the deflection of device components in undesired dimensions during MEM device's 105 response to an applied or changing magnetic field H. As shown in FIG. 2, it is preferable to arrange the springs 130 symmetrically about a centrally located magnetic element 115 and circular hub 122. As also illustrated in FIG. 2, each of the springs 130 can be a meandering or serpentine spring. One skilled in the art would understand how to adjust the number of beams 202 of the springs 130, the beam's length 204, and beam's width 206, or other physical properties, to increase or decrease their stiffness to a desired value. For example, in some preferred embodiments, each spring 130 comprises from one to five beams 202, each beam 202 having a length 204 of about 100 microns to 1 millimeter, and a width 206 of about 2 to 10 micrometers.

Also shown in FIG. 2, the MEM device 205 can comprise a plurality of comb capacitors 110. Similar to the springs 130, it is desirable for the comb capacitors 110 to be symmetrically located about the centrally located magnetic element 115 and hub 122. For instance, each movable electrode 117 of the plurality of comb capacitors 110 can be physically connected to the magnetic element 115 through the hub 122. As shown in FIG. 2 there can be eight symmetrically arranged comb capacitors 110. However, in alternative embodiments there is at least four symmetrically arranged comb capacitors 110. MEM devices 205 having four or more symmetrically arranged comb capacitors are advantageous because this allows the compensation of undesired lateral movements and rotations of the moving components of the apparatus 200.

When the magnetic element 115 moves in response to an applied or changing magnetic field H, the electrode 117 moves in a manner that changes the capacitance of each of the comb capacitors 110. The change in capacitance from the plurality comb capacitors 110 can be manipulated, for example by adding or averaging, to provide a more accurate measurement of the intensity or direction of the magnetic field H. For example by taking an average, one can minimize changes in capacitance causes by undesired movements in the MEM device, such as lateral displacements of the hub 122 or moveable electrode 117.

As also illustrated in FIG. 2, the comb capacitors 110 further include a second fixed electrode 180. As shown selected fixed electrodes 180 are physically connected to a ring 225 of the substrate 125. The ring 225 surrounds the magnetic element 115. Connection to the ring 225 facilitates the common electrical coupling of the fixed electrodes 180.

Another aspect of the present invention is a method of use. FIGS. 3-6 present plan views of an exemplary apparatus 300 at various stages of use. FIGS. 3-6 use the same reference numbers to depict analogous structures shown in FIGS. 1A-1C. However, any of the various embodiments of the apparatuses discussed above and illustrated in FIGS. 1A-1C and 2 could be used in the method.

Figure 3:
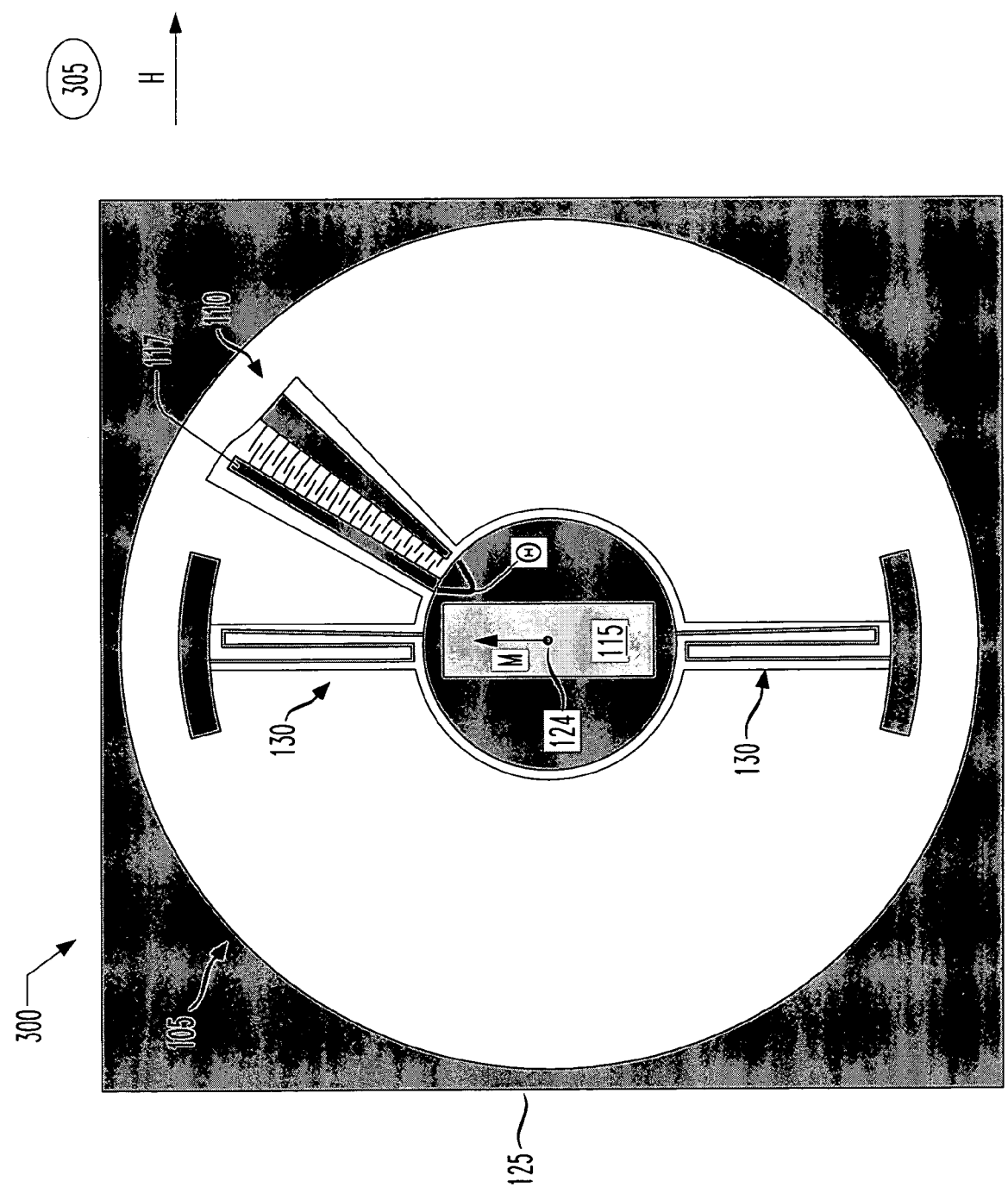
FIGS. 3-5 present plan views of an exemplary embodiment of an apparatus at selected stages of use.

As illustrated in FIG. 3, the apparatus 300 comprises a MEM device 205 having a comb capacitor 110 and a magnetic element 115 physically connected to one electrode 117 of the comb capacitor 110. The apparatus 300 includes a substrate 125 and one or more spring 130, the springs 130 physically connecting the magnetic element to the substrate 125.

FIG. 3 illustrates the apparatus 300 after placing the apparatus 300 in a magnetic field H. The source 305 of the magnetic field H could be a planet's magnetic field or the magnet field from a permanent magnet, temporary magnet or electromagnet. In some cases, such as when the source 305 is the earth's magnet field H the intensity of the field ranges from about $3 \times 10^{-4}$ Gauss to about $6 \times 10^{-4}$ Gauss.

Figure 4:
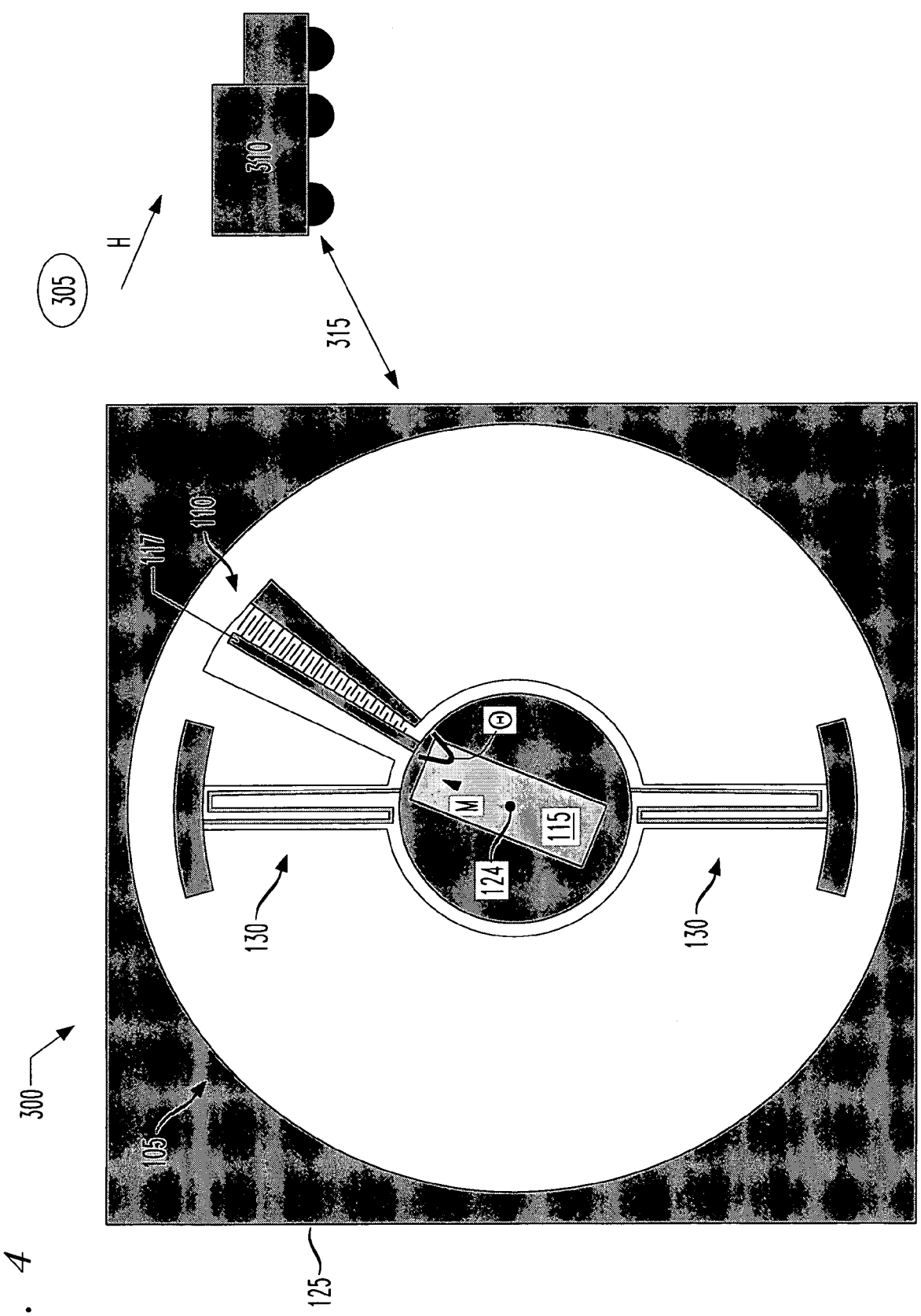

Referring now to FIG. 4, while maintaining reference to FIG. 3, shown is the apparatus 300 after changing the magnetic field H. The change in magnetic field could be a change in intensity, direction or both. In some cases, the change corresponds to an about 1 to 10 percent change in the intensity of the magnetic field H. In other cases the change in magnetic field H can be measured with a precision of about $1 \times 10^{-6}$ Gauss or better. The change in magnetic field H could be temporary, due for example, to the movement of a metal-containing object 310 close to the apparatus 300. For example, when a metal-containing object 310 passes close to the apparatus 100 the earth's magnetic field is distorted in a manner that causes a change in the magnetic field H sensed by the apparatus 300. In some cases metal-containing object 310 is separated from the apparatus 300 by a distance 315 ranging from about 1 cm to about 1 km. In other cases metal-containing object 310 is separated from the apparatus 300 by less than a distance 315 of less than 1 cm. Alternatively, the change in the magnetic field could be due to a change in the magnetic properties of the source 305 itself.

As discussed above, the change in the magnet field H causes the magnetic element 115 to move the electrode 117 of the comb capacitor 110 in a manner that alters its capacitance. For the embodiment of the apparatus 300 shown in FIG. 4, the changing magnetic field H causes the magnetic element 115 to rotate clockwise. The rotation causes the movement of the electrode 117 towards the fixed electrode 140, resulting in an increase in capacitance. Of course in other instances the change in magnetic field H could cause the magnetic element 115 to rotate counter-clockwise resulting in a decrease in capacitance.

Preferred embodiments of the method further include determining an intensity or direction of the change in the magnetic field H. In some preferred embodiments this determination is based on measurements of the altered capacitance of the comb capacitance. As discussed above, the change in capacitance can be determined by measuring a change in current passing through the comb capacitor 110.

In some preferred embodiments of the method, it is desirable to use the altered capacitance to estimate an angle of rotation Θ of the electrode 117. The angle of rotation Θ, in turn, can be related to the change in magnetic field H intensity or direction.

For the embodiments of the apparatus such as presented in FIGS. 1-6, the angle of rotation Θ refers to the change in angle of a dimension 320 (FIG. 3) along the long axis of the electrode 117 that runs through the axis 124 of the hub 122. FIG. 4 shows the dimension before 320 and after 405 the change in magnetic field H. As discussed above, the angle of rotation Θ of the one electrode 117 is linearly related to the amount of overlap between interdigitated fingers 133, 135 of the comb capacitor 110. Consequently, change in capacitance of the comb capacitor 110 can be linearly related to the angle of rotation Θ of the electrode 117. The above-described linear relation facilitates associating the change in capacitance to the movement of the magnetic element 115 caused by the change in the magnetic field H.

In some cases, the springs 130 connecting the magnetic element 115 to the substrate 125 opposes the movement of the electrode 117. For example, the spring 130 can be configured to oppose the rotation of the magnetic element 115, thus opposing the rotation of the electrode 117. This can be desirable in situations where the change in magnetic field H is large enough to cause the magnetic element 115 to move the electrode 117 to the maximum angle of rotation Θ allowed by the particular configuration of the MEM device 105.

Figure 5:
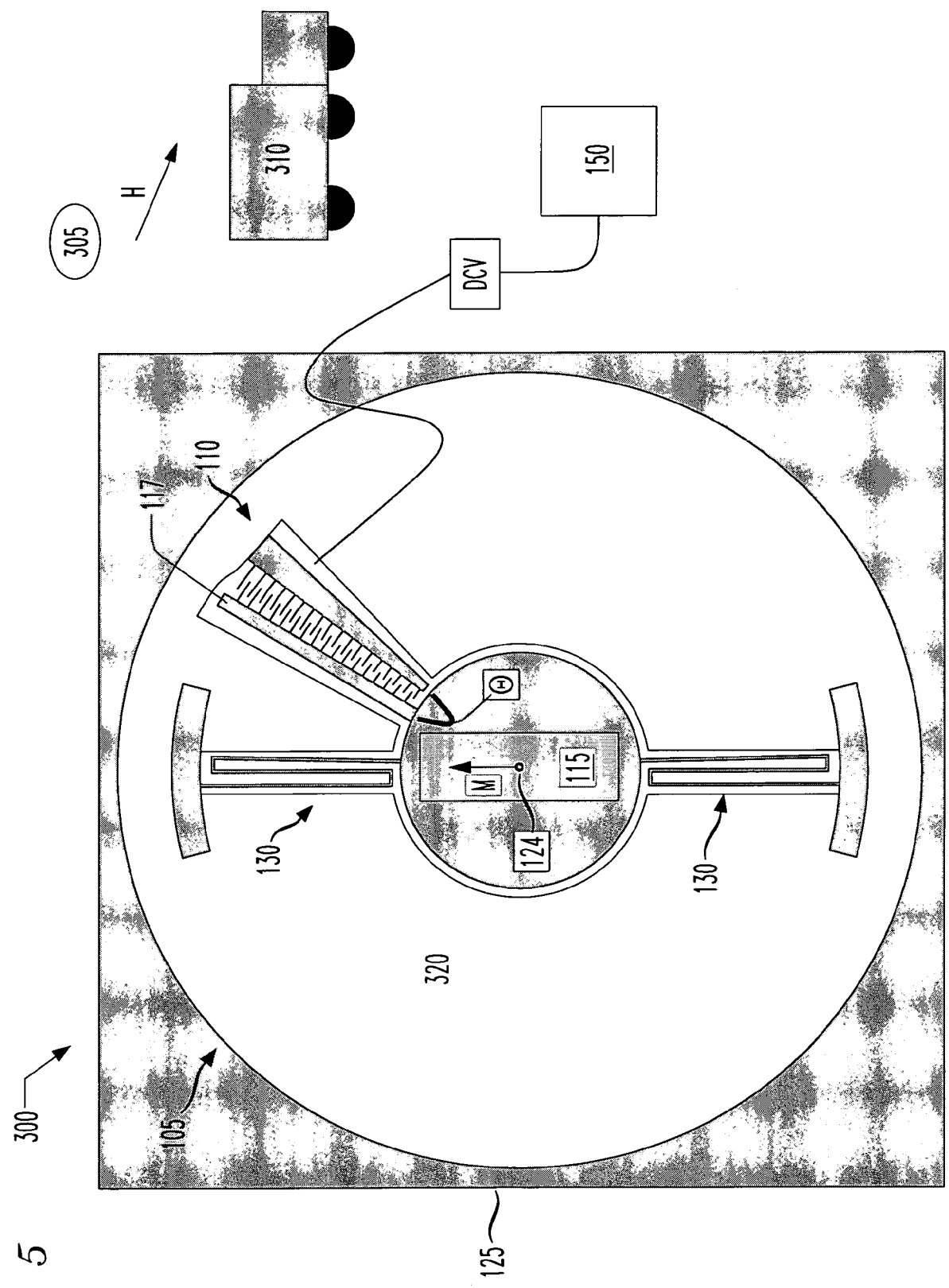

Turning to FIG. 5, in some preferred embodiments of the method, a DCV is applied across the comb capacitor 110 such that the DCV produces a torque on the magnetic element 115 and the spring 130. The DCV can be adjusted such that the torque opposes the movement of the electrode 117, for example, by opposing the electrode's rotation. As illustrated in FIG. 5, the applied DCV can be adjusted to return the magnetic element 115 to its original position prior to its movement. In some cases, the angle of rotation Θ is linearly related to the square of the applied voltage ($DCV^2$) required to return the magnetic element 115 to its original position.

One of ordinary skill in the art would understand how to estimate the intensity and direction of the magnetic field H, by considering the values of parameters such as the magnetic moment of the magnetic element 115, the stiffness of the spring 130, the angle of rotation Θ of the electrode 117 and the applied DCV. An alternative method to determine the magnetic field H includes measuring the shift in the resonance frequency of the MEM device as discussed in Bolle et al., Nature 399: 43-46, 1999, which in incorporated by reference herein in its entirety. Additionally, one of ordinary skill in the art would understand how to combine two or more apparatus 300 to measure different vector components of the magnetic field H.

Figure 6:
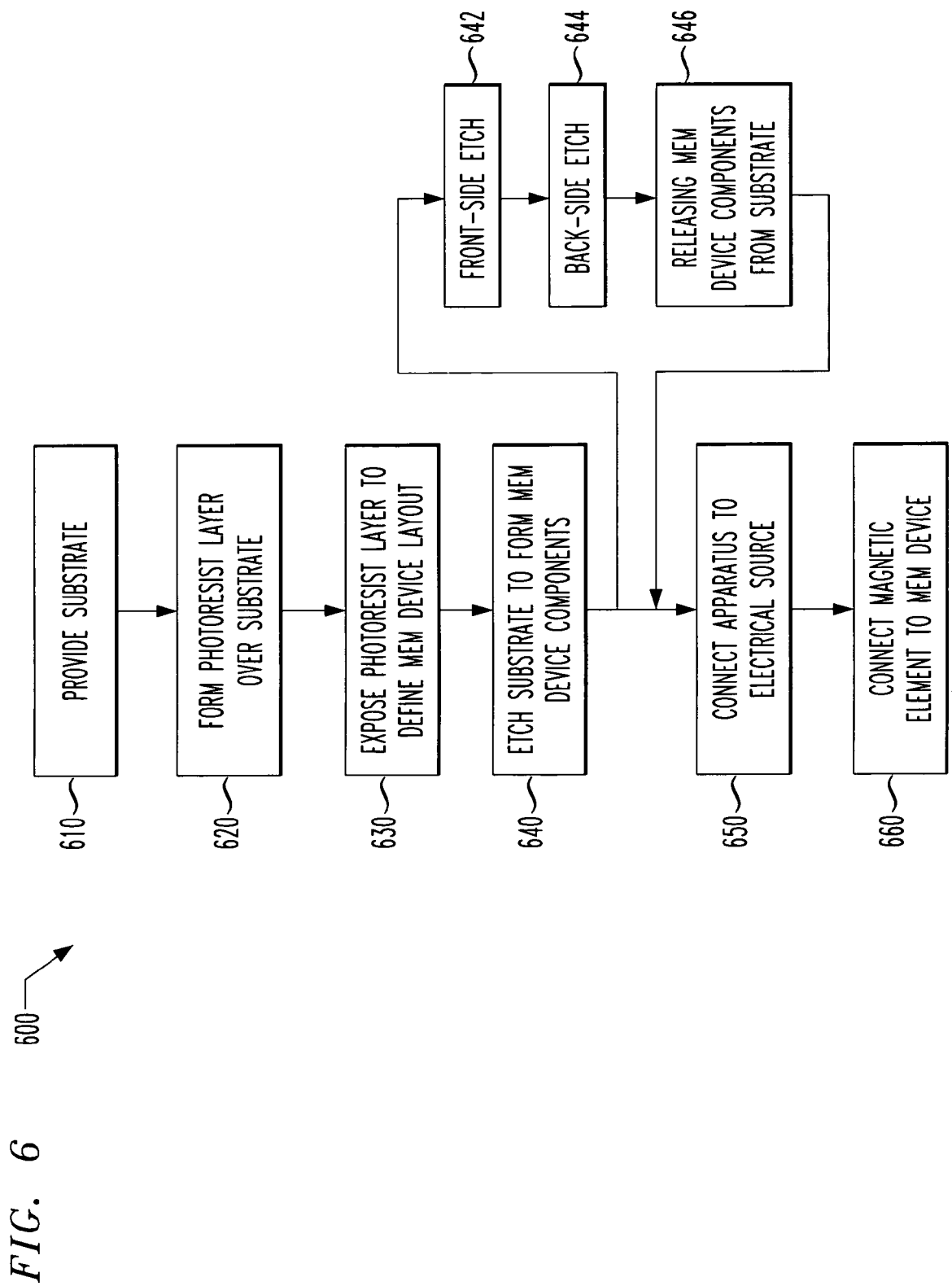
FIG. 6 presents a flow diagram showing selected steps in an exemplary method of manufacturing an apparatus.

Another embodiment of the present invention is a method of manufacture. FIG. 6 presents a flow diagram showing selected stages in an exemplary method of manufacturing an apparatus of the present invention.

A substrate is provided in step 610. The substrate can comprise a substrate used in high voltage electronics, such as a planar silicon-on-insulator wafer. One skilled in the art would be familiar with other types of substrates or multi-layered substrates that could be used to provide the appropriate support frame or a support structure.

A conventional photoresist layer is formed over, e.g., the front of the substrate in step 620, and in step 630, portions of the photoresist layer are exposed and removed using conventional photolithography procedures. The exposed portions of the photoresist define a layout analogous to the plan views of the MEM devices illustrated in any of FIGS. 1-5.

In step 640 the substrate is etched using the remaining portions of photoresist as a mask to simultaneously form the MEM device components, such as a comb capacitor and a spring physically connected to the comb capacitor. It is preferable to form other components of preferred embodiments of the MEM device in this same etching step. Any conventional etchants and etching processes can be used to accomplish step 640. In some preferred embodiments of the method, etching comprises a deep ion etch (DRIE). In particular it is desirable to use a DRIE process that gives vertical sidewalls to the structure being etched. An example of a suitable DRIE process, the Bosch process, is presented in U.S. Pat. No. 5,501,893, which is incorporated by reference herein in its entirety.

In cases where the substrate comprises an SOI wafer, etching the substrate can include, in step 642, etching an upper layer of silicon down to an oxide layer and using the oxide layer as an etch stop. In some cases, etching the substrate can further include a backside etch in step 644. For example, when the substrate comprises an SOI wafer, a backside etch can be done to remove portions of a lower silicon layer, e.g., the handle silicon wafer.

In still other cases, the process can also include a step 646 of releasing a surface MEM device components, such as the comb capacitor from the substrate. Consider again the situation where the substrate comprises an SOI wafer and the comb capacitor is formed by etching portion of the upper silicon layer. In step 646, comb capacitor can be released from the substrate by exposing the partial constructed apparatus to a hydrofluoric acid bath. Portions of the oxide layer underlying the comb capacitor are dissolved thereby releasing the bottom surface of the comb capacitor from the substrate. The same process can be used to release other components of the MEM device from the substrate.

In step 650 the components of the apparatus, such as the MEM device components, are electrically connected to an electrical source. For example the fixed electrodes of the comb capacitor can be connected to the electrical source by conventional wire bonding, flip-chip bonding or other conventional techniques to achieve electromechanical attachment.

In step 660 a magnetic element is physically connected to the MEM device, such as the moveable electrode of the comb capacitor. As discussed above in the context of FIGS. 1A-1C, the magnetic element is configured to move the one electrode to alter a capacitance of the comb capacitor. In some preferred embodiments the magnetic element is bonded to a hub that is connected to the moveable electrode.

In some cases the magnetic element is bonded by being glued to the hub. In other cases the magnetic element is bonded by being electroplated to the hub. The magnetic element can be composed of any material capable of having a magnetic moment. In some cases the magnetic element is a hard magnet. Preferred compositions include SmCo or NdFeB.

To further illustrate certain steps in the process discussed in the context of FIG. 6, FIGS. 7-12 presents cross-section views of an exemplary apparatus 700 at selected stages of manufacture. The cross-sectional views shown in FIGS. 7, 9 and 11 correspond to view line 7-7 of an apparatus analogous to that shown in FIG. 1A. The cross-sectional views shown in FIGS. 8 and 10 correspond view line 8-8 of an apparatus analogous to that shown in FIG. 1A. FIGS. 7-11 uses the same reference numbers to depict analogous structures shown in FIG. 1A. Any of the various embodiments of the apparatus discussed above and illustrated in FIGS. 1-5 could be incorporated into the apparatus 700 shown in FIGS. 7-12 and manufactured as discussed herein.

Figure 7:
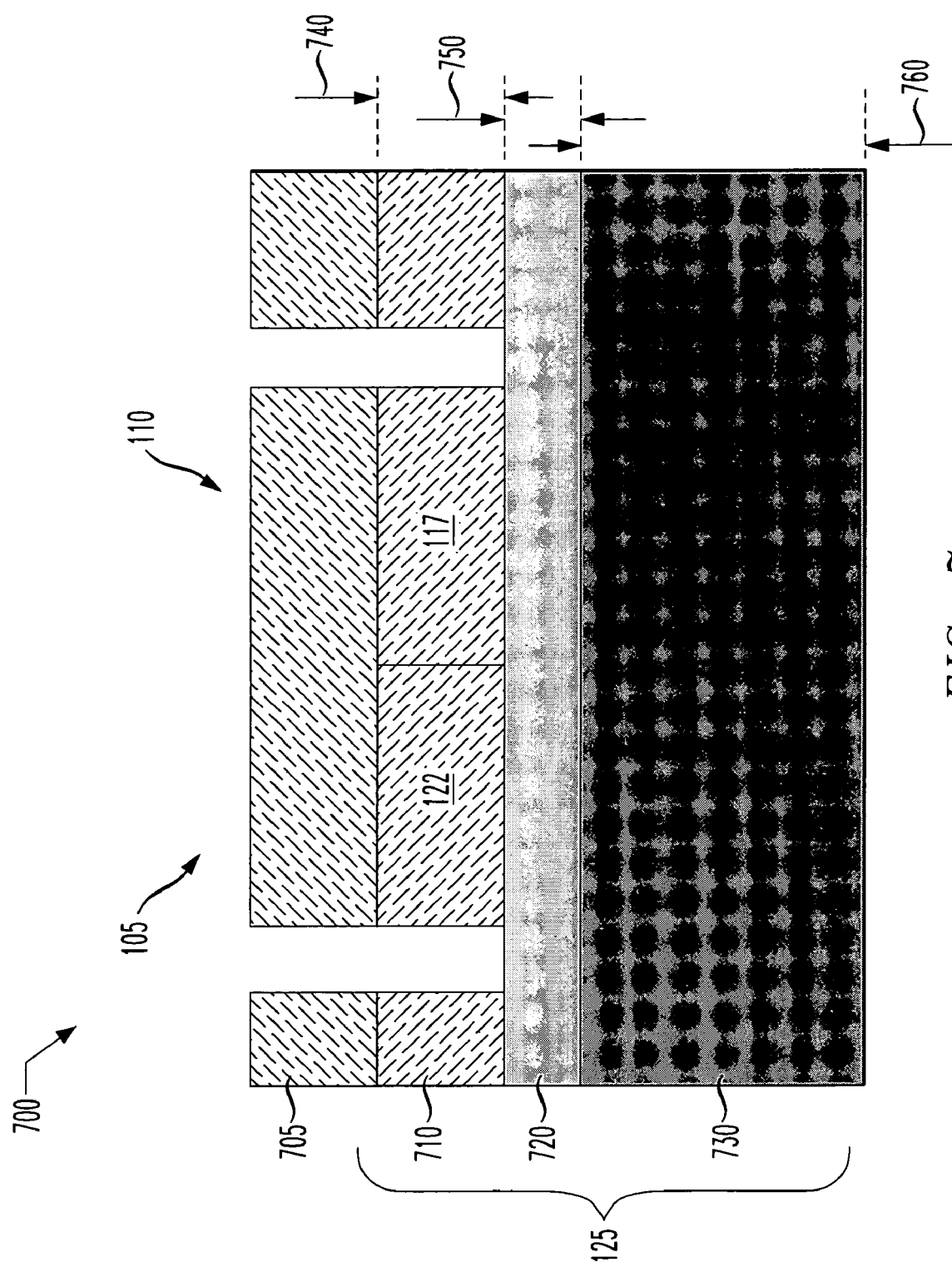
FIGS. 7-12 present cross-section views of an exemplary embodiment of an apparatus at selected stages of manufacture.

With continuing reference to FIG. 6, FIG. 7 illustrates the partially-constructed apparatus 700 after conducting steps 610, 620, 630 to provide a substrate 125 and deposit and expose a photoresist 705 to form the layout for the MEM device 105.

FIG. 7 also shows the apparatus 700 after completing a portion of step 640 of etching the substrate 125 to form MEM device 105 components as per step 642. Any of the processes discussed above in the context of step 640 in FIG. 6 can be used to accomplish substrate etching. FIG. 7 illustrates the apparatus after performing the front-side etch described in step 642 to form a comb capacitor 110. Other components of the comb capacitor 110, which are not visible along view line 7-7, such as the interdigitated fingers and fixed electrodes are formed by etching the substrate, similar to that shown for the moving electrode 117.

In the illustrated embodiment, the substrate 125 is a SOI wafer comprising a top layer 710 of silicon, a middle layer 720 of oxide and a bottom layer 730 of silicon. In some preferred embodiments, the SOI substrate 125 comprises a top layer 710 having a thickness 740 ranging from about 35 to 45 microns, a middle layer 720 having a thickness 750 of about 1 to about 2 microns and a bottom layer 730 having a thickness 760 of about 500 to about 1000 microns. Consequently in some embodiments, the moveable electrode 117, hub 122, and spring 130 have a thickness that is substantially the same as the thickness 740 of the top layer 710.

Figure 8:
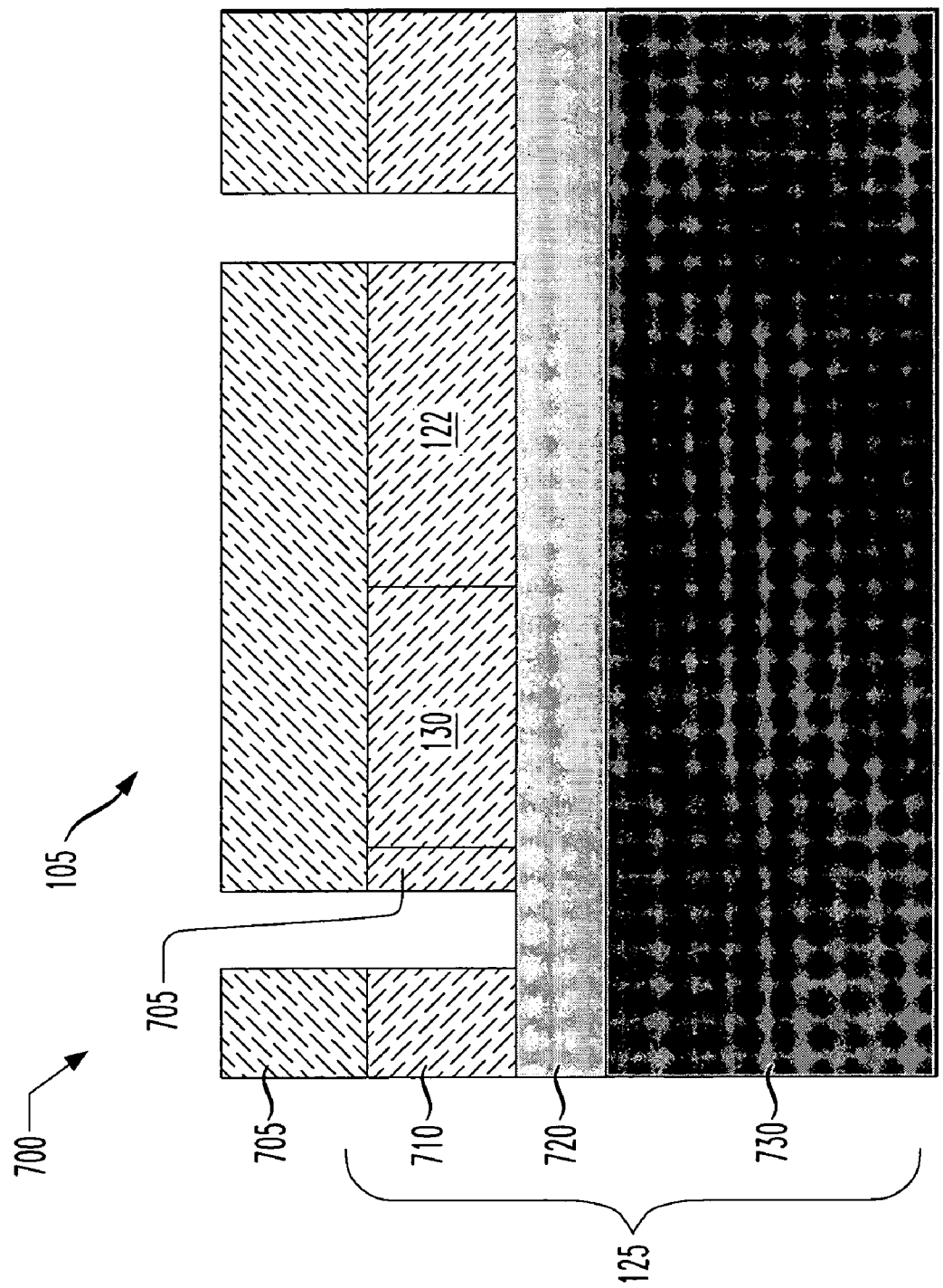

Turning to FIG. 8, while maintaining reference to FIGS. 6-7, illustrated is the partially-constructed apparatus 700 at the same point in the fabrication process as shown in FIG. 7. The apparatus is shown after the front-side etch of the substrate 125, in this case the top layer 710, to form a spring 130 physically connected to the comb capacitor 110. As illustrated for the partially completed apparatus 700 shown in FIG. 8, the spring 130 is physically connected to the hub 122 and anchor 132, and the hub 122 is physically connected to the moveable electrode 117 of the comb capacitor 110. Hence the spring 130 is physically connected to the comb capacitor 110. In preferred embodiments of the method, as show in FIGS. 7-8, the comb capacitor 110, hub 122, spring 130, anchor 132 and other MEM device 105 components are all formed simultaneously by a front-side etch of the top layer 710, using the middle layer 720 as an etch stop.

Figure 9:
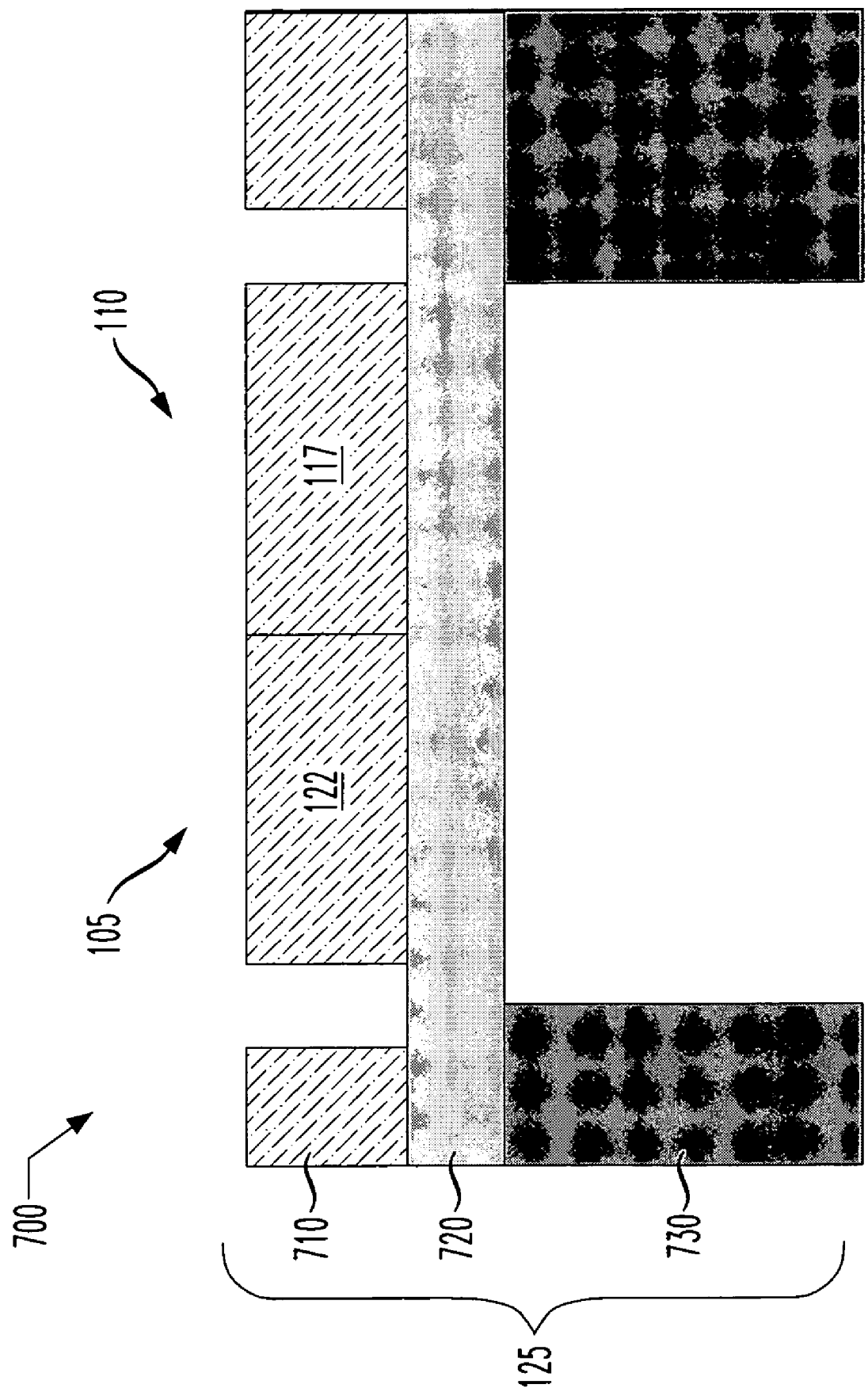
Figure 10:
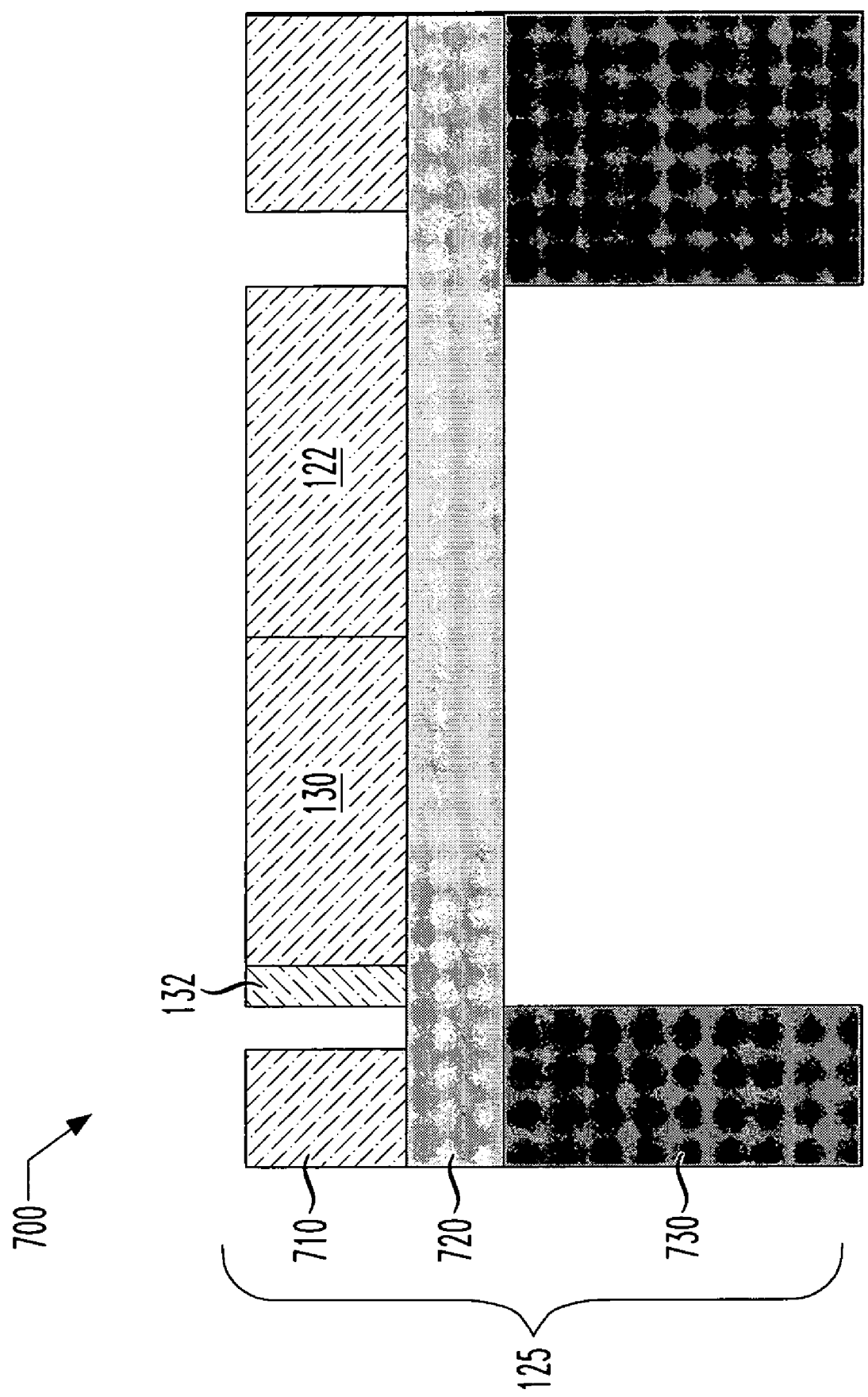

While maintaining reference to FIGS. 6-8, illustrated in FIGS. 9 and 10 is the partially-constructed apparatus 700 after performing a back-side etch of the substrate 125 in accordance with step 644. FIGS. 9-10 also show the partially-constructed apparatus 700 after removing the photoresist. The back-side etch removes portions of the bottom layer 730 of silicon under those components of the MEM device 105 that are configured to move. For example, as illustrated in FIGS. 9-10, the bottom layer 730 of silicon is removed underneath the moving electrode 117, the hub 122 and the spring 130.

Figure 11:
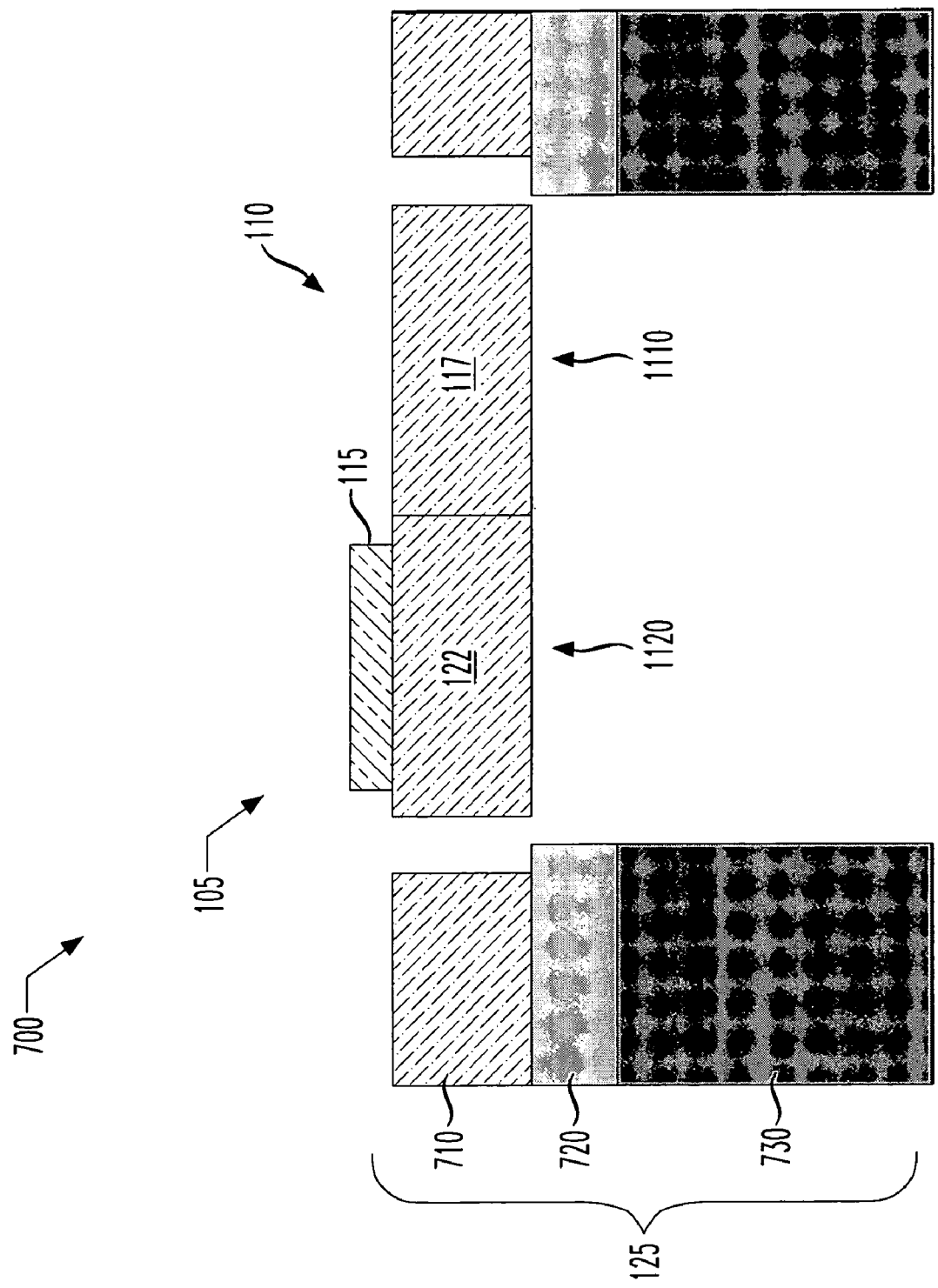
Figure 12:
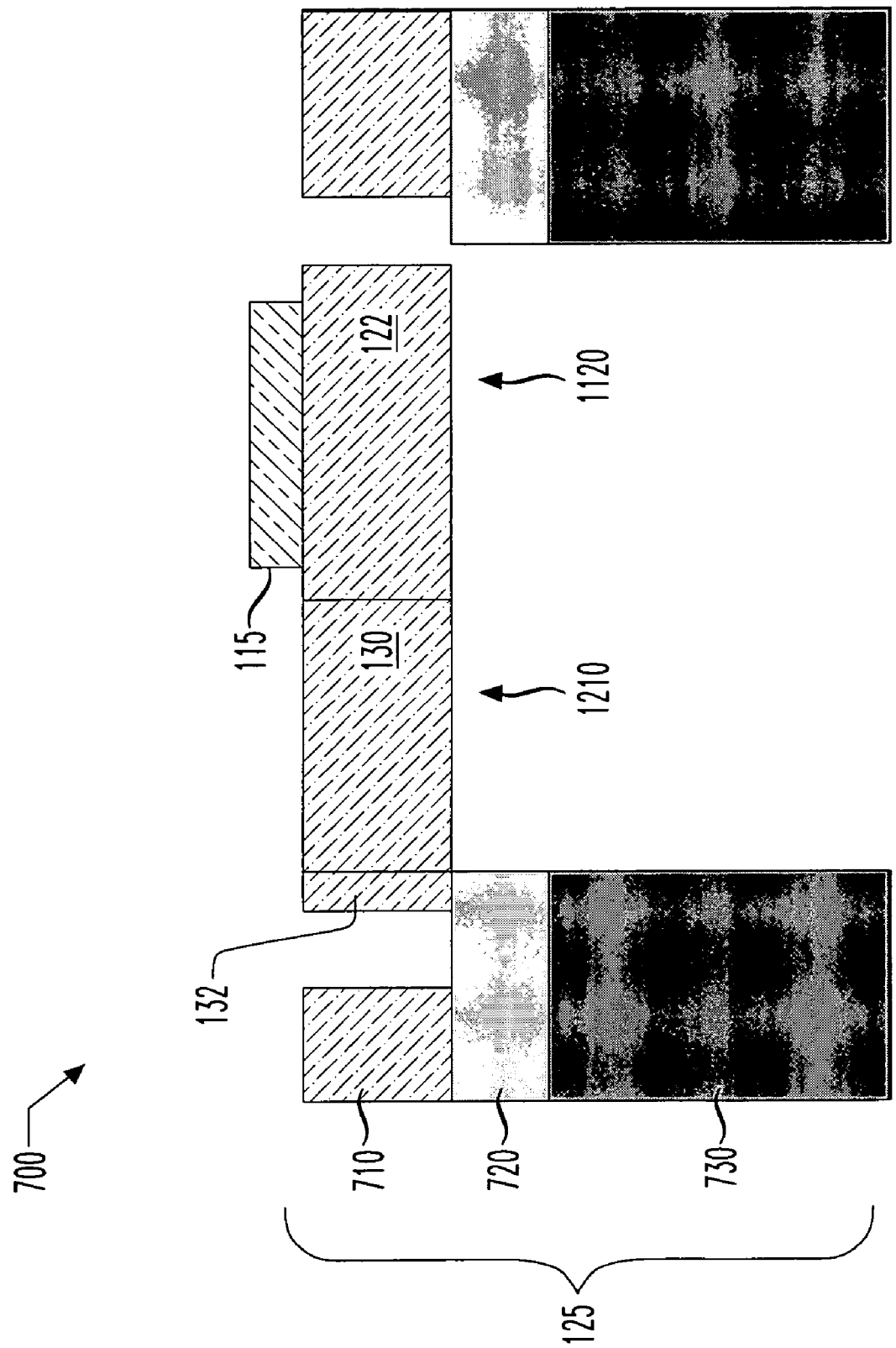

With continuing reference to FIGS. 7-8, FIG. 11 shows a cross-sectional view analogous to FIG. 7, after releasing a surface 1110 of the comb capacitor 110 from an oxide layer 720 of the substrate 125. FIG. 12 shows a cross-sectional view analogous to FIG. 8, after releasing a surface 1210 of the spring 130 from an oxide layer 720 of the substrate 125 in accordance with step 646. Both FIGS. 11 and 12 illustrate a surface 1120 of the hub 122 after being released from the oxide layer 720. Any of the processes discussed above in the context of step 646 in FIG. 6 can be used to release the surfaces 1110, 1120, 1210.

With continuing reference to FIGS. 7-10, FIG. 11 also shows a cross-sectional view analogous to FIG. 7, after physically connecting a magnetic element 115 to the MEM device 105 in accordance with step 660. For the embodiment shown in FIG. 11, the magnetic element 115 is connected to the moveable electrode 117 by attachment to a hub 122. FIG. 12 also shows a cross-sectional view analogous to FIG. 8, after attachment of the magnetic element 115 to the hub 122. The magnetic element 115 can be glued to the hub 122. of course, other methods, as discussed above in the context of step 660 in FIG. 6, could be used to attach the magnetic element 115.

Although the present invention has been described in detail, those of ordinary skill in the art should understand that they can make various changes, substitutions and alterations herein without departing from the scope of the invention.

What is claimed is:

1. An apparatus, comprising:
   a substrate;
   a MEM device including a comb capacitor and a magnetic element physically connected to one electrode of said comb capacitor, said magnetic element capable of moving said one electrode in a manner that alters a capacitance of said comb capacitor; and
   at least one spring physically connecting said magnetic element to said substrate, wherein said comb capacitor comprises a fixed electrode having fixed fingers projecting from a fixed surface opposing a surface of the one electrode, said one electrode having fingers that interdigitate with said fixed fingers.

2. The apparatus of claim 1, wherein said magnetic element is configured to rotate, said rotation causing said movement of said one electrode.

3. The apparatus of claim 1, wherein said at least one spring holds said magnetic element such that rotations of said magnetic element are able to vary an amount of inter-digitation of said fixed fingers of said comb capacitor.

4. The apparatus of claim 1, wherein said comb capacitor further comprises a second fixed electrode having second fixed fingers projecting from a second fixed surface that opposes a second surface of said one electrode, said second surface having fingers that interdigitate with said second fixed fingers.

5. The apparatus of claim 1, further comprising a drive circuit configured to apply a voltage across said comb capacitor such that said voltage produces a torque on said at least one spring.

6. The apparatus of claim 1, wherein said MEM device is configured to detect changes in a magnetic field.

7. The apparatus of claim 1, wherein said apparatus is a metal detector.

8. The apparatus of claim 1, wherein said apparatus is a magnetometer.

9. A method of use, comprising:
   placing an apparatus in a magnetic field, where said apparatus comprises a MEM device having a comb capacitor, a magnetic element physically connected to one electrode of said comb capacitor and at least one spring physically connecting said magnetic element to a substrate of said apparatus, wherein said comb capacitor comprises a fixed electrode having fixed fingers projecting from a fixed surface opposing a surface of the one electrode, said one electrode having fingers that interdigitate with said fixed fingers; and
   changing said magnetic field thereby causing said magnetic element to move said one electrode in a manner that alters a capacitance of said comb capacitor.

10. The method of claim 9, wherein said changing magnetic field causes said magnetic element to rotate, said rotation causing said movement of said one electrode.

11. The method of claim 9, wherein a capacitance of said comb capacitor is linearly related to an angle of rotation of said magnetic element.

12. The method of claim 11, wherein said angle of rotation is at least about 1 degree.

13. The method of claim 9, wherein at least one spring physically connecting said magnetic element to a substrate of said MEMS device opposes said movement of said one electrode.

14. The method of claim 9, applying a voltage across said comb capacitor such that said voltage produces a torque on said magnetic element.

15. The method of claim 14, wherein said torque opposes said movement of said one electrode.

16. The apparatus of claim 1, wherein there is a constant gap between adjacent interdigitated said fixed fingers of said fixed electrode and said fingers of said one electrode over a range of rotation of said magnetic element.

17. The apparatus of claim 1, wherein said fixed fingers of said fixed electrode and said fingers of said one electrode are both arc-shaped.

18. The apparatus of claim 1, said capacitance is linearly dependent upon an amount of overlap between said interdigitated fingers.

19. The method of claim 9, wherein there is a constant gap between adjacent interdigitated said fixed fingers of said fixed electrode and said fingers of said one electrode during a rotation of said magnetic element.

* * * * *